US006975038B1

(12) United States Patent
Mostafazadeh

(10) Patent No.: US 6,975,038 B1
(45) Date of Patent: Dec. 13, 2005

(54) CHIP SCALE PIN ARRAY

(75) Inventor: Shahram Mostafazadeh, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/625,917

(22) Filed: Jul. 23, 2003

Related U.S. Application Data

(62) Division of application No. 09/698,736, filed on Oct. 26, 2000, now Pat. No. 6,689,640.

(51) Int. Cl.$^{7}$ .......................... H01L 23/48; H01L 23/52
(52) U.S. Cl. ....................... 257/780; 257/737; 257/734
(58) Field of Search ................................ 257/697, 673, 257/792, 668, 690, 734, 733, 737, 780, 781

(56) References Cited

U.S. PATENT DOCUMENTS 5,585,195 A 12/1996 Shimada
5,656,550 A 8/1997 Tsuji et al.
5,719,440 A * 2/1998 Moden ....................... 257/697
5,759,874 A 6/1998 Okawa
5,830,800 A * 11/1998 Lin ........................... 438/459
5,847,458 A 12/1998 Nakamura et al.
5,866,948 A 2/1999 Murakami et al.
5,895,234 A 4/1999 Taniguchi et al.
5,923,080 A 7/1999 Chun
5,998,875 A 12/1999 Bodö
6,034,422 A 3/2000 Horita et al.
6,100,594 A 8/2000 Fukui et al.
6,130,473 A 10/2000 Mostafazadeh et al.
6,157,080 A 12/2000 Tamaki et al.
6,177,288 B1 1/2001 Takiar
6,238,952 B1 5/2001 Lin
6,247,229 B1 6/2001 Glenn
6,255,740 B1 * 7/2001 Tsuji et al. ................. 257/792
6,258,626 B1 * 7/2001 Wang et al. ................ 438/107
6,261,864 B1 7/2001 Jung et al.

(Continued)

OTHER PUBLICATIONS

U.S Appl. No. 09/528,540, entitled "Leadless Packaging Process Using a Conductive Substrate", filed Mar. 20, 2000, inventor(s): Bayan et al.
U.S. Appl. No. 09/698,784, entitled "Flip Chip Scale Package", filed Oct. 26, 2000, inventor(s): Shahram Mostafazadeh.
U.S. Appl. No. 09/698,736, entitled "Chip Scale Pin Array", filed Oct. 26, 2000, inventor(s): Shahram Mostafazadeh.

(Continued)

*Primary Examiner*—Michael Trinh
*Assistant Examiner*—Kiesha Rose
(74) *Attorney, Agent, or Firm*—Beyer Weaver & Thomas LLP

(57) ABSTRACT

An integrated circuit package with lead fingers with a footprint on the order of the integrated circuit footprint is provided. A lead frame may be made from a metal sheet, which may be stamped or etched. The lead frame provides a plurality of posts and a connecting sheet connecting the plurality of posts. Dice are adhesively mounted to the plurality of posts. The dice have a conductive side with a plurality of conducting pads where each conducting pad is electrically and mechanically connected to a post. An encapsulating material is placed over the dice and lead frame, with the connecting sheet keeping the encapsulating material on one side of the lead frame. Parts of the connecting sheet are then removed, electrically isolating the posts. The integrated circuit packages formed by the encapsulated dice and leads may be tested as a panel, before the integrated circuit packages are singulated.

21 Claims, 10 Drawing Sheets

U.S. PATENT DOCUMENTS

| | | | | |
|---|---|---|---|---|
| 6,306,684 | B1 | 10/2001 | Richardson et al. | |
| 6,306,685 | B1 | 10/2001 | Liu et al. | |
| 6,307,755 | B1 | 10/2001 | Williams et al. | |
| 6,316,837 | B1 | 11/2001 | Song | |
| 6,333,252 | B1 | 12/2001 | Jung et al. | |
| 6,342,730 | B1 | 1/2002 | Jung et al. | |
| 6,355,507 | B1 | 3/2002 | Fanworth | |
| 6,358,778 | B1 * | 3/2002 | Shinohara | 438/123 |
| 6,451,627 | B1 | 9/2002 | Coffman | |
| 6,762,511 | B2 * | 7/2004 | Satsu et al. | 257/789 |

* cited by examiner

CHIP SCALE PIN ARRAY

RELATED APPLICATIONS

This application is a divisional of U.S. patent application Ser. No. 09/698,736 filed Oct. 26, 2000 now U.S. Pat. No. 6,689,640, entitled "Chip Scale Pin Array," from which priority under 35 U.S.C. § 120 is claimed and which is hereby incorporated by reference.

This application is related to the commonly assigned application Ser. Nos. 09/590,551 entitled "LEAD FRAME DESIGN FOR CHIP SCALE PACKAGE," filed on Jun. 9, 2000, and Ser. No. 10/211,130, having the same title, filed on Jul. 31, 2002, both by Shahram Mostafazadeh and incorporated herein by reference.

This application is also related to the commonly assigned application Ser. No. 09/791,437 entitled "Chip Scale and Land Grid Array Semiconductor Packages," filed on Feb. 22, 200, which is incorporated herein by reference.

This application is also related to the now abandoned application Ser. No. 09/698,784 entitled "FLIP CHIP SCALE PACKAGE," filed on Oct. 26, 2000, by Shahram Mostafazadeh which is incorporated herein by reference.

FIELD OF THE INVENTION

The present invention relates generally to integrated circuit packages. More specifically, the invention relates to chip scale integrated circuit packages.

BACKGROUND OF THE INVENTION

An integrated circuit (IC) package encapsulates an IC chip (die) in a protective casing and may also provide power and signal distribution between the IC chip and an external printed circuit board (PCB). An IC package may use a metal lead frame to provide electrical paths for that distribution.

To facilitate discussion, FIG. 1 is a top view of a lead frame panel 100 made up for a plurality of lead frames that may be used in the prior art. The lead frame may comprise leads 108, die attach pads 112, ties 116 for supporting the die attach pads 112, and a skirt 120 for supporting the plurality of leads 108 and ties 116. The lead frame panel 100 may be etched or stamped from a thin sheet of metal. IC chips 124 may be mounted to the die attach pads 112 by an adhesive epoxy. Wire bonds 128, typically of fine gold wire, may then be added to electrically connect the IC chips 124 to the leads 108. Each IC chip 124 may then be encapsulated with part of the leads 108 and the die attach pad 112 in a protective casing, which may be produced by installing a preformed plastic or ceramic housing around each IC chip or by dispensing and molding a layer of encapsulating material over all IC chips 124. FIG. 2 is a cross-sectional view of part of the lead frame panel 100 and IC chips 124. In a process described in U.S. patent application Ser. No. 09/054,422, entitled "Lead Frame Chip Scale Package", by Shahram Mostafazadeh et al., filed Apr. 2, 1998, a tape 136 is placed across the bottom of the lead frame panel 100 and an encapsulating process is used to encapsulate the IC chips 124, the wire bonds 128, and part of the lead frame panel 100. The tape 136 prevents the encapsulating material 140 from passing through the lead frame panel 100. Once the encapsulating material 140 is hardened, the tape 136 may be removed. The encapsulating material 140 may be cut to singulate the IC chips 124 and leads 108. The resulting singulated IC chips have leads with a length 155 which is substantially parallel to the conductive surface of the IC chips 124.

It is desirable to provide an IC package process which does not require the steps of creating wire bonds between the die and leads, adding tape to the lead frame, and then removing the tape from the lead frame. It is also desirable to provide a process and lead frame that provides lead fingers and a chip scale footprint.

SUMMARY OF THE INVENTION

To achieve the foregoing and other objects and in accordance with the purpose of the present invention, the invention provides an integrated circuit package. The integrated circuit package comprises a first die with a conductive side, a plurality of lead posts where the conductive side of the first die faces the plurality of lead posts, and an encapsulating material encapsulating the first die and an end of the lead posts adjacent to the conductive side of the die.

Another aspect of the invention provides a method for packaging integrated circuits. Generally, a lead frame of a conductive material with a plurality of lead posts and a connecting sheet connecting the plurality of lead posts is provided. A plurality of first dice is attached to the lead frame, wherein each first die is electrically and mechanically connected to a plurality of the plurality of lead posts, and wherein a conductive side of each first die faces the plurality of lead posts. The plurality of dice is then encapsulated with an encapsulating material.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well-known process steps and/or structures have not been described in detail in order to not unnecessarily obscure the present invention.

Figure 3:
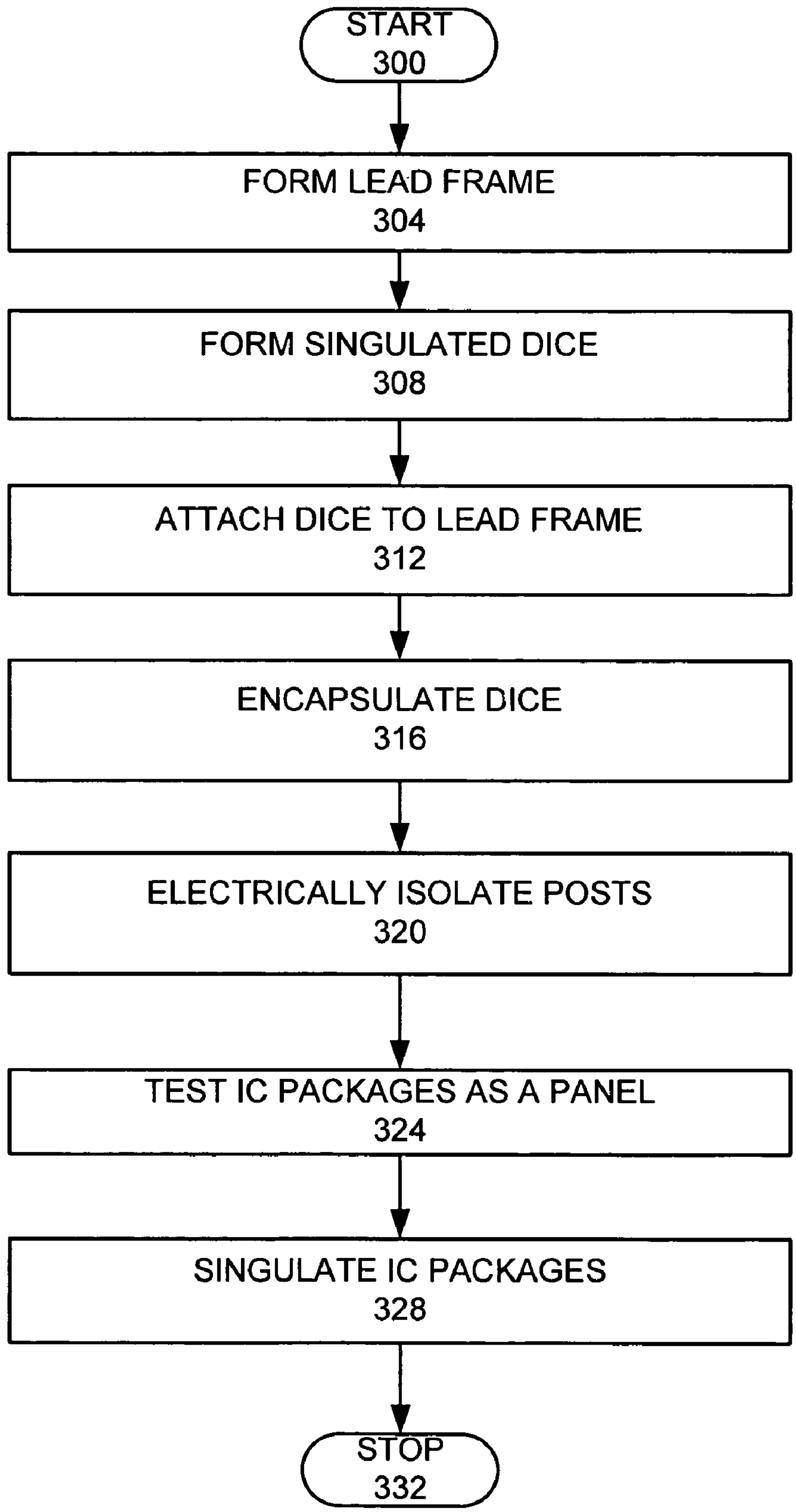
FIG. 3 is a flow chart of a process used in a preferred embodiment of the invention.
Figure 4:
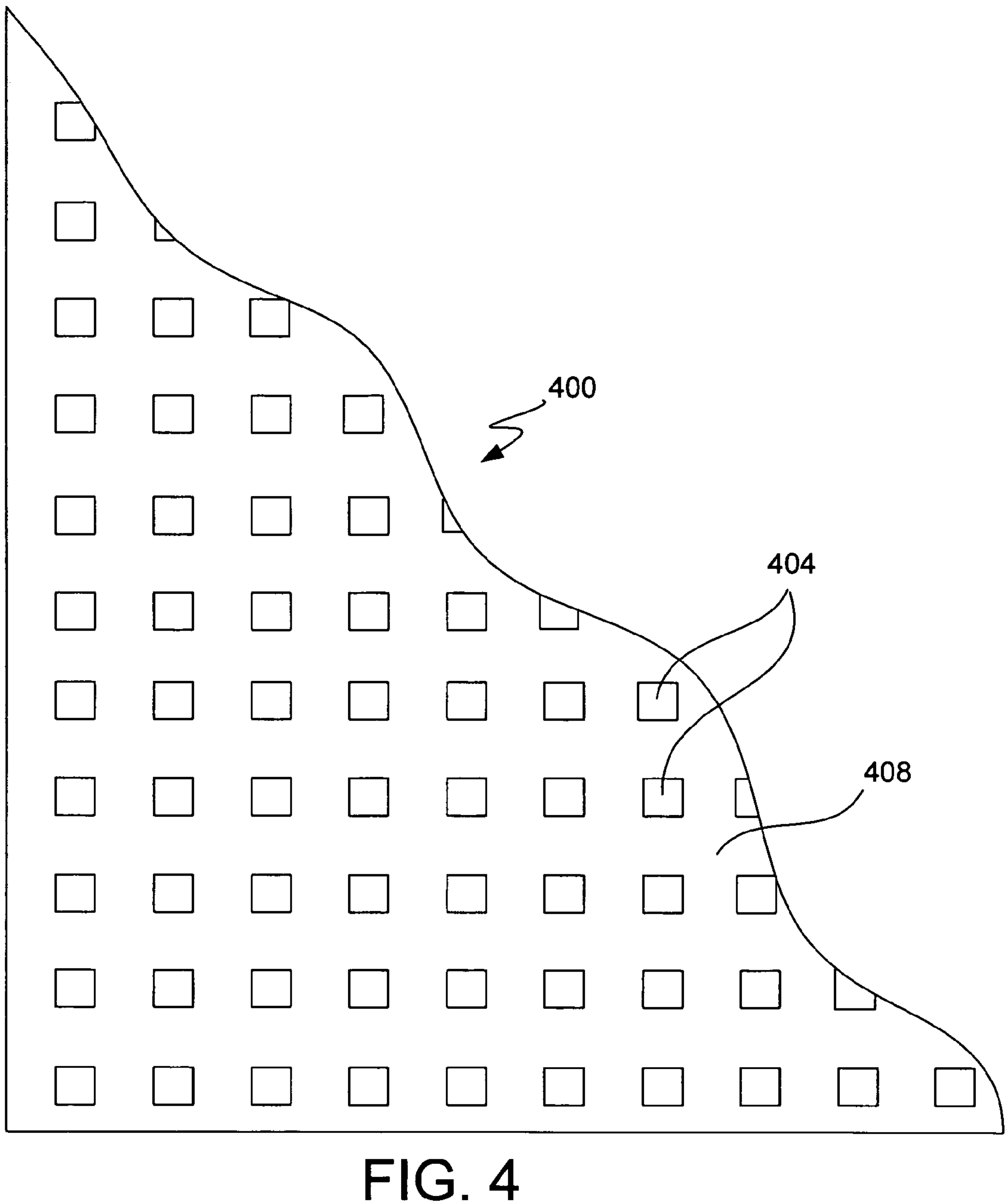
FIG. 4 is a top view of part of a metal sheet, which is formed to a lead frame.
Figure 5:
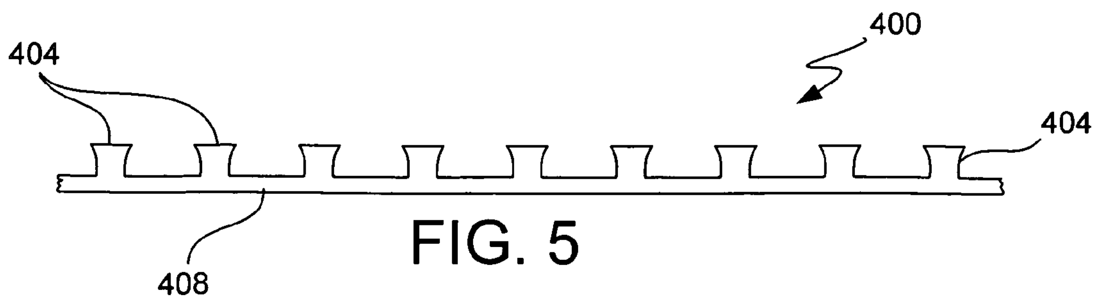
FIG. 5 is a cross-sectional view of part of the lead frame.

To facilitate discussion, FIG. 3 is a flow chart of a method used in a preferred embodiment of the invention. A lead frame is formed (step 304). FIG. 4 is a top view of part of a metal sheet, which is formed to a lead frame 400. The lead frame 400 is preferably copper; however, other electrically conductive materials, such as Alloy 42, may be used instead. FIG. 5 is a cross-sectional view of part of the lead frame 400. The lead frame 400 may be formed by stamping or etching a sheet of metal. The lead frame 400 provides a plurality of posts 404. In this embodiment, the posts 404 all have the same cross-section. In addition, the posts 404 are spaced apart to form an array. The array is formed by aligning posts vertically and horizontally in columns and rows, so that the vertical spacing is equal to the horizontal spacing. In other embodiments the spacing and location of the posts may vary to meet specific requirements. As illustrated, in this embodiment a connecting sheet 408 extends through the lead frame 400 so that the connecting sheet 408 is connected to an end of each of the posts 404. The connecting sheet 408 is imperforate in that it extends between the posts 404 without any apertures. Plating, such as silver plating, may be added to the lead frame 400. Much of the packaging handling equipment is designed for handling lead frame strips; therefore, the part of the lead frame shown may be a part of a lead frame strip. Such a lead frame strip may provide a skirt surrounding several connecting sheets with posts. Such connecting sheets would be imperforate with the skirt having apertures to relieve stress. Alternatively, the part of the lead frame shown may be part of a square or rectangular panel.

Figure 1:
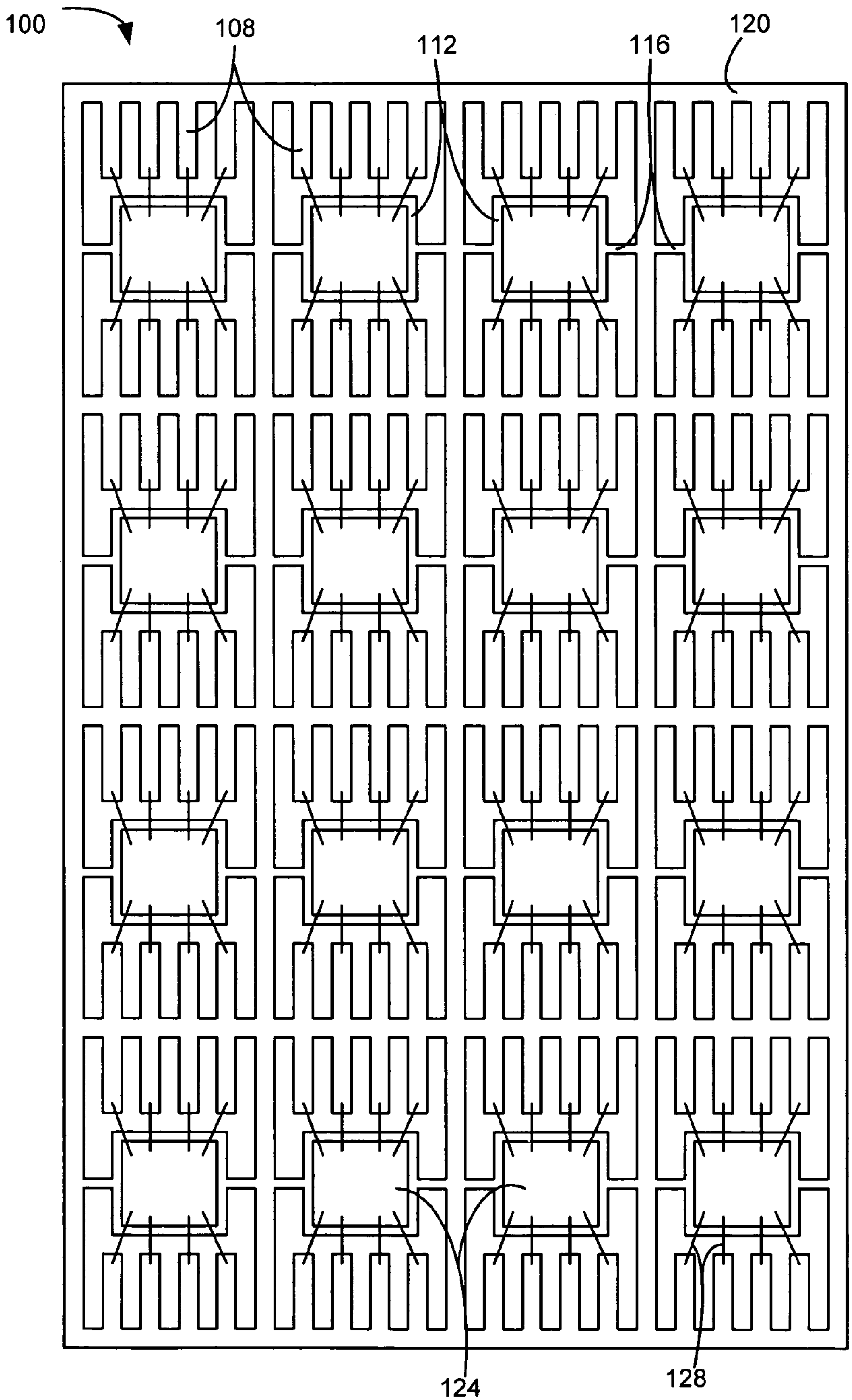
FIG. 1 is a top view of a lead frame and die assembly used in the prior art.
Figure 2:
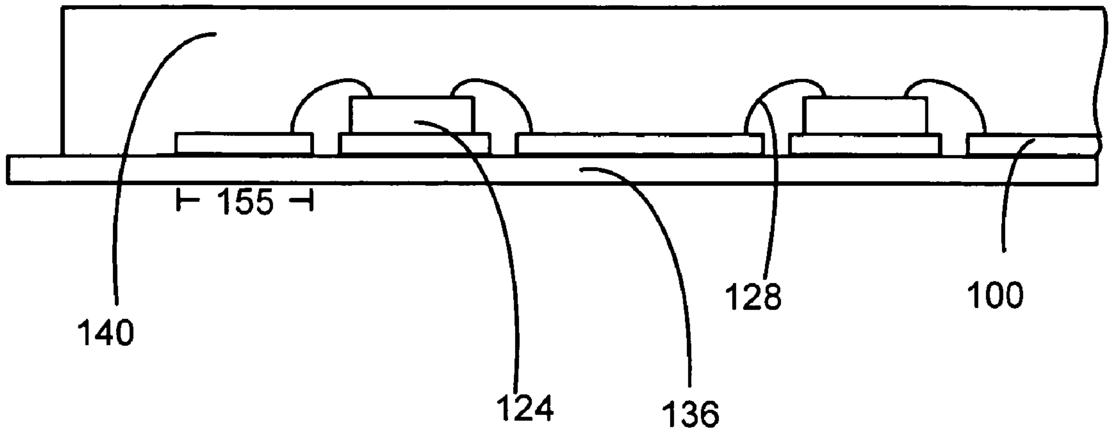
FIG. 2 is a cross-sectional view of part of the lead frame panel illustrated in FIG. 1.
Figure 6:
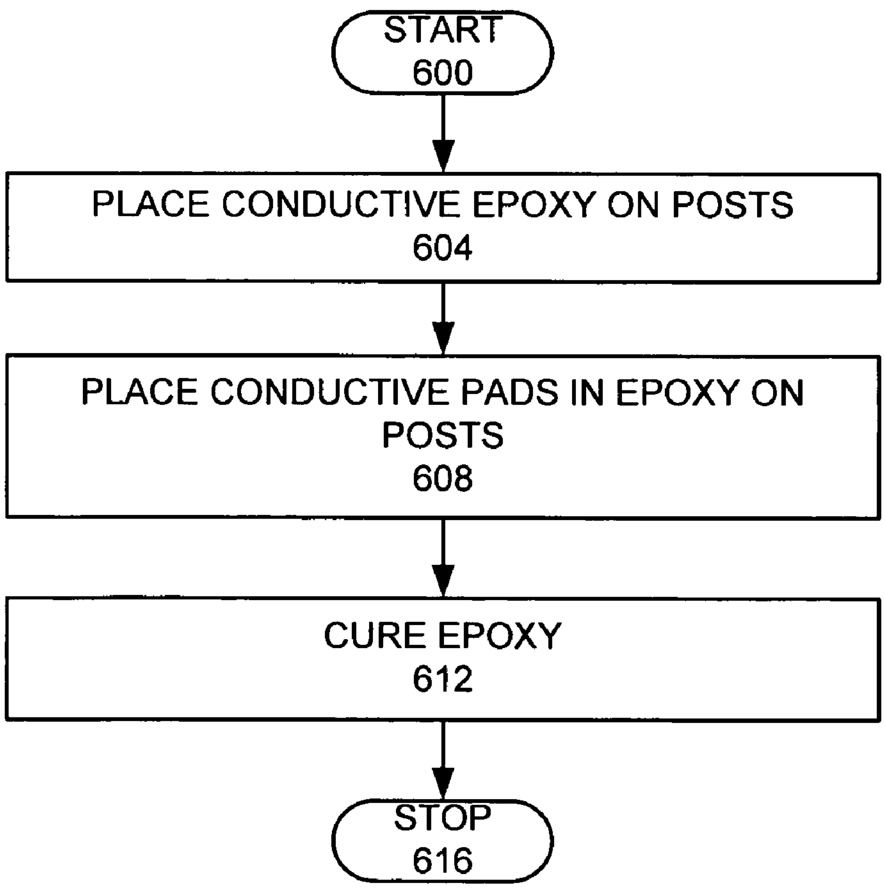
FIG. 6 is a detailed flow chart of one embodiment of the step of attaching the dice to the lead frame.
Figure 7:
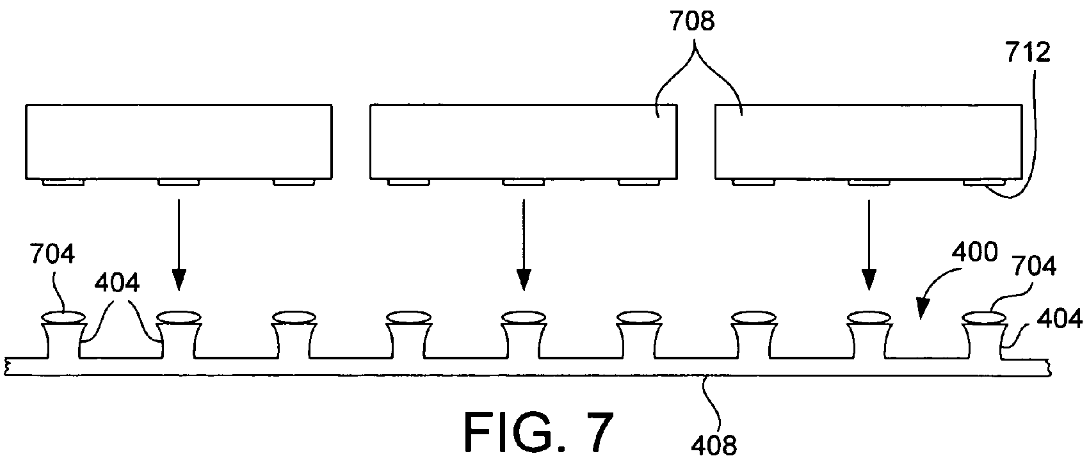
FIG. 7 is a cross-sectional view of a lead frame with conductive epoxy and with dice.
Figure 8:
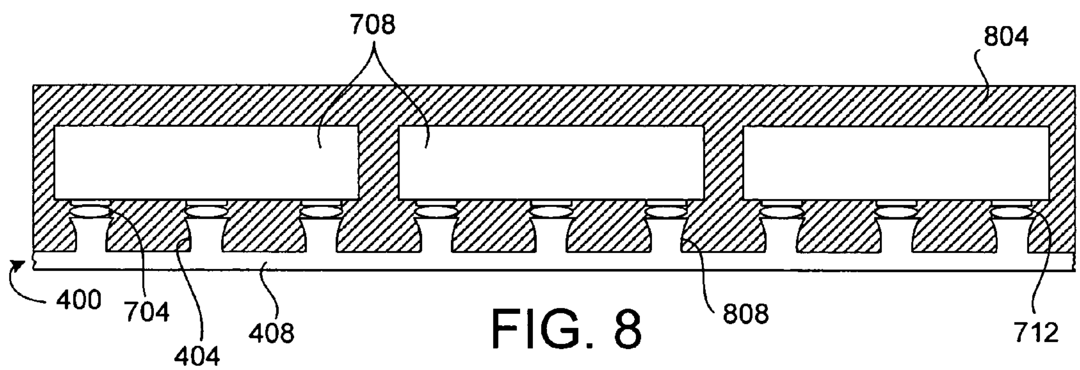
FIG. 8 is a cross-sectional view of encapsulated dice mounted on the lead frame.

A plurality of singulated dice is formed (step 308). The dice are then attached to the lead frame 400 (step 312). FIG. 6 is a detailed flow chart of one embodiment of the step of attaching the dice to the lead frame. In this embodiment, a conductive epoxy 704 is placed on an upper surface of the posts 404 of the lead frame 400 (step 604), as shown in FIG. 7. A roller may be used to place the epoxy on the upper surface of the posts 404. To place the conductive pads of the dice in the conductive epoxy (step 608), dice 708 are placed over the posts 404 with the side of the dice having conductive pads 712 closest to the conductive epoxy 704, as shown in FIG. 7. The dice 708 are electrically and mechanically mounted on upper parts of the posts 404 by placing the conductive pads 712 in the conductive epoxy 704 so that the conductive side of each die is facing the posts 404, as shown in FIG. 8. The epoxy 704 may be regular conductive epoxy, which is applied just before the dice are placed. In the alternative, the epoxy may be a conductive B stage epoxy, which is applied and partially cured. After the dice are placed, the conductive stage B epoxy is reheated to melt the epoxy. Once the dice 708 are mounted, the conductive epoxy 704 may be dried and cured (step 612). The conductive pads 712 are on the conductive side of the dice, so that the conductive side of the dice is the closest part of each die to the posts.

The dice 708 may then be encapsulated (step 316). Using conventional molding the lead frame 400 can be encapsulated by an encapsulating material 804, as shown in FIG. 8. If a dispensing method is used, then a dam may be placed around the lead frame 400. Since the connecting sheet 408 is imperforate in that it extends between the posts without any apertures, the connecting sheet prevents the encapsulating material from flowing under the lead frame 400, thus keeping the encapsulating material on one side of the lead frame 400. The encapsulating material may then be hardened and cured to form a cap. One cap may be used to cover the entire lead frame. In the alternative, several caps may be provided at various parts of the lead frame. In this embodiment, the posts 404 have curved sides 808 to provide additional locking of the encapsulating material 804 to the posts 404.

Figure 9:
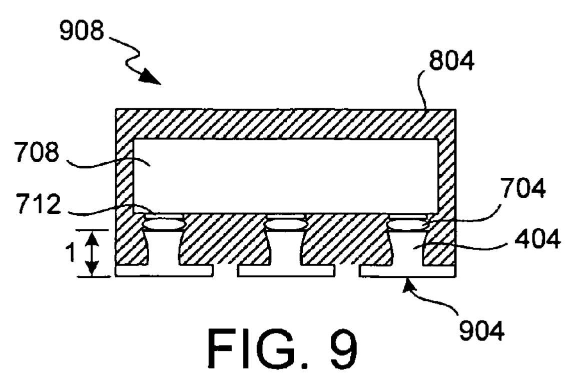
FIG. 9 is a cross-sectional view of a singulated integrated circuit package.

The lead frame 400, dice 708, and encapsulating material 804 may be mounted on sticky tape and then placed on a vacuum chuck of sawing equipment, which is known in the art. The sawing equipment may be used for removing all or parts of the connecting sheet 408 to electrically isolate the posts 440 (step 320). In such a removal process, the sawing equipment may cut through only the connecting sheet 408 between the plurality of posts 404. The removal of parts of the connecting sheet forms the posts 404 into lead fingers 904, which may be electrically isolated from each other, as shown in FIG. 9. Etching may be used in the alternative to make isolated lead fingers. In the alternative, the connecting sheet may be polished off. Since the IC packages have not been singulated, the IC packages are in one piece held together by the encapsulating material 804. This allows all IC packages to be tested in panel form (step 324), which allows faster and easier testing. After testing, the saw equipment may then be used to singulate the lead frame 400, dice 708, and encapsulating material 804 into individual IC packages 908 (step 328), as shown in FIG. 9. In such a singulation process, the sawing equipment cuts through the encapsulating material 804.

If panel testing is not desired, then the chip scale IC packages may be singulated before electrical testing. In such a case, singulation may be performed during the step of removing the connection sheet. In other embodiments, other methods besides using saw equipment, such as etching or laser cutting, may be used to remove the connection sheet and/or for singulation.

The lead fingers 904 or lead posts 404 have a length "l" which extends from the top of the posts 404 to the bottom of the posts, wherein the length "l" is substantially perpendicular to the conductive surface of the die, as shown. The length "l" of the lead fingers 904 or lead posts 404 is more perpendicular to the conductive surfaces of the dice than parallel to the conductive surfaces as was shown in the description of the prior art. The resulting IC package has a footprint on the order of the footprint of the die, as shown. Since the lead fingers are on only a single side of the die, which is the conductive side of the die, and since the length of the lead fingers is perpendicular to the conductive surface of the die, the footprint of the lead fingers is about equal to the footprint of the die, as shown. The conductive epoxy provides both a mechanical connection between the die and lead frame and an electrical connection between the conducting pads and the posts of the lead frame. The frame allows dice of different sizes and different input/output counts may be accommodated. In some embodiments, all of the connecting sheets are removed and in other embodiments at least part of the connecting sheet is removed so that the posts may be formed into electrically isolated lead fingers. No wire bonding is required in this embodiment, thus eliminating a processing step.

Figure 10:
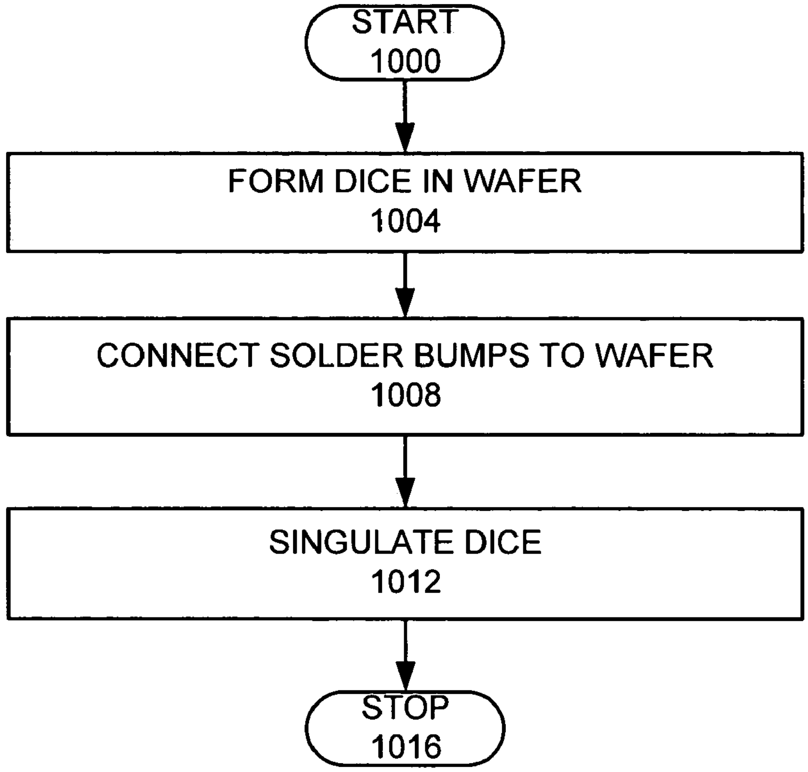
FIG. 10 is a flow chart of the forming of the singulated dice in another embodiment of the invention.
Figure 11:
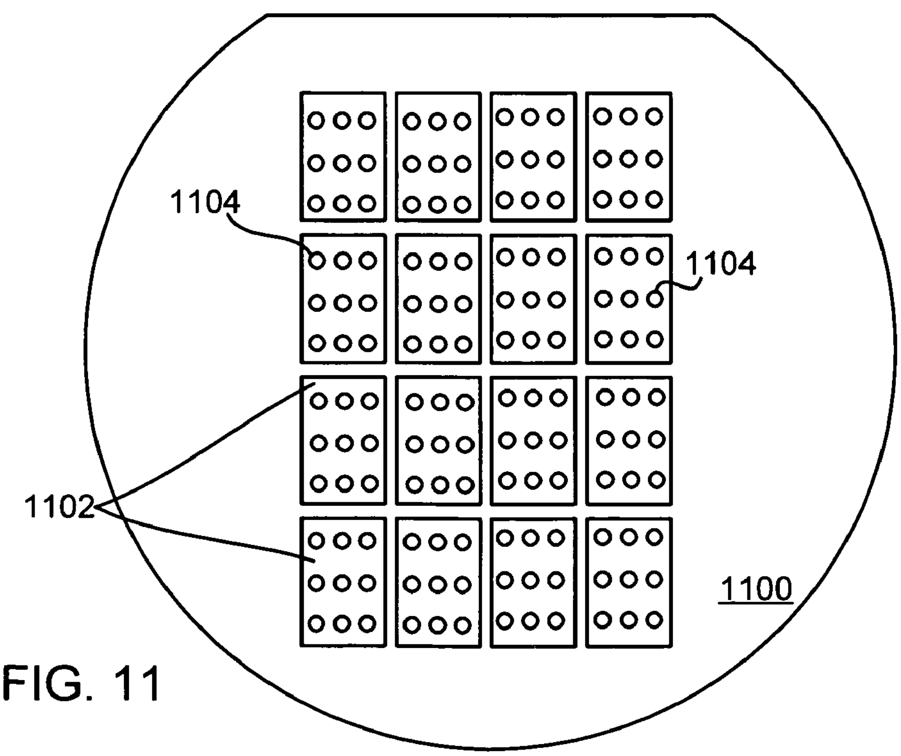
FIG. 11 is a top view of a wafer with a plurality of bumped dice.
Figure 12:
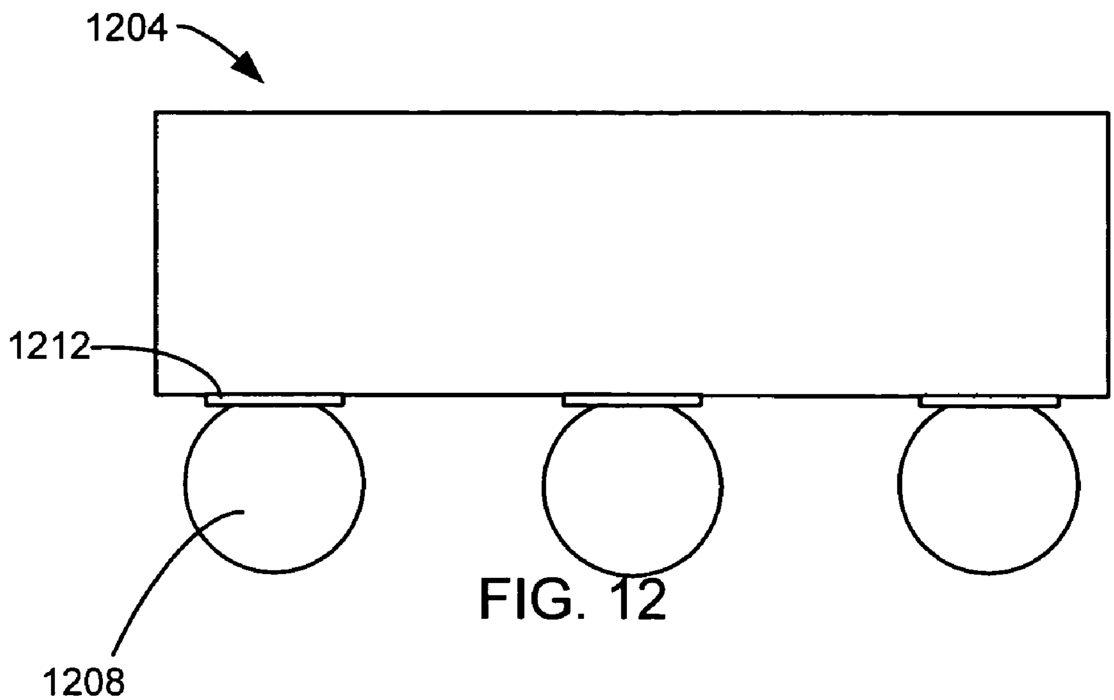
FIG. 12 is a side view of a singulated die with solder bumps attached to conductive pads.

In another embodiment of the invention, using FIG. 3 as a high-level flow chart, a lead frame is formed (step 304). The lead frame may be the same lead frame shown in FIGS. 4 and 5. Singulated dice are also formed (step 308). FIG. 10 is a flow chart of the forming of the singulated dice in this embodiment of the invention. First dice are formed on a wafer (step 1004). FIG. 11 is a top view of a wafer 1100 with a plurality of dice 1102. Bumps of conductive material, such as solder bumps 1104, are formed on conductive pads of the dice 1102 (step 1008). The wafer 1100 is then cut to singulate the bumped dice (step 1012). In other embodiments, these steps may be done in a different order, such as singulating the dice before adding the bumps of conductive material. FIG. 12 is a side view of a singulated die 1204 with solder bumps 1208 attached to conductive pads (attach pads) 1212. The conductive pads are on the conductive side of each die.

Figure 13:
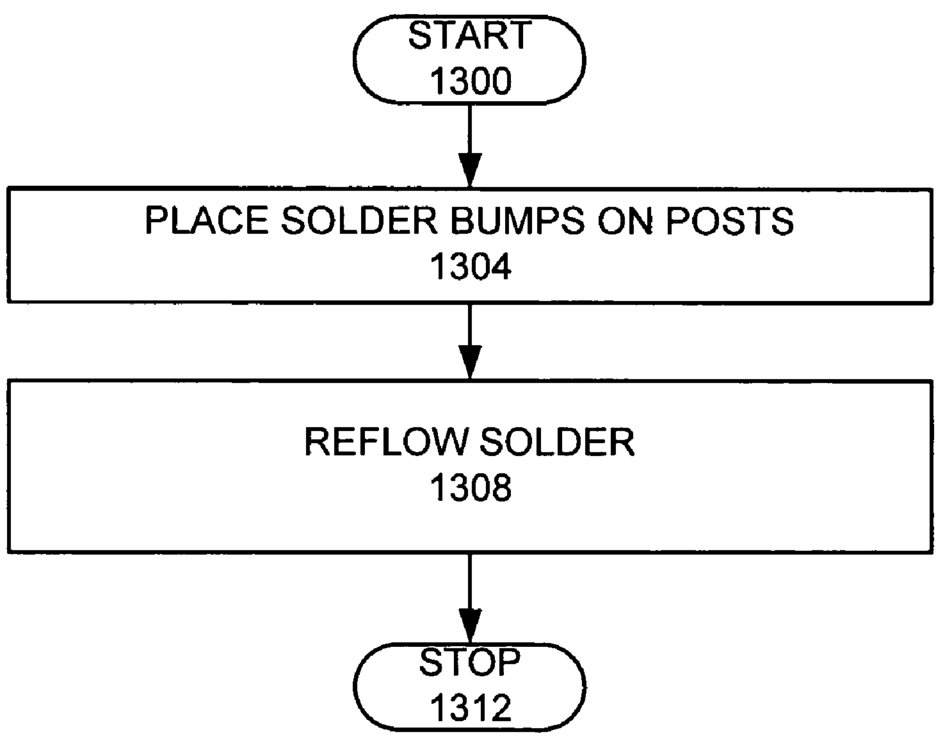
FIG. 13 is a detailed flow chart of the step of attaching the singulated bumped dice to the metal frame.
Figure 14:
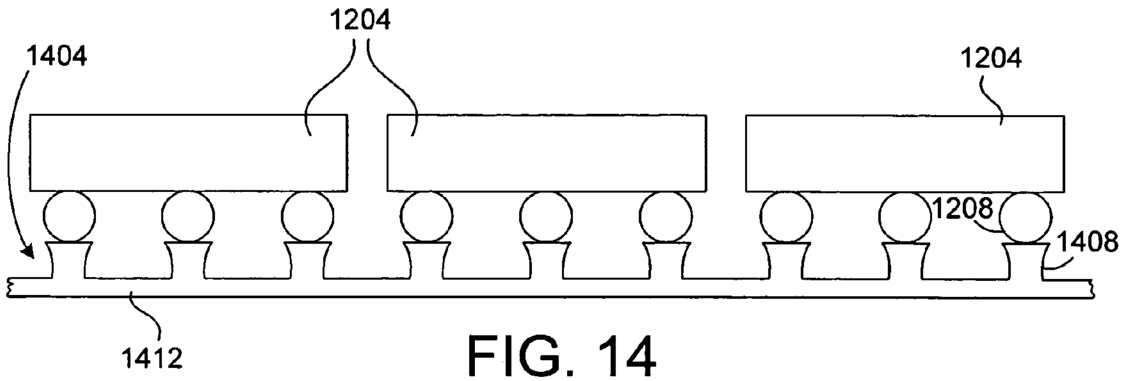
FIG. 14 is a cross-sectional view of a lead frame with bumped dice attached.

The singulated bumped dice are then attached to the lead frame (step 312). FIG. 13 is a detailed flow chart of the step of attaching the singulated bumped dice to the lead frame. The dice 1204 are placed on the lead frame 1404 so that the solder bumps 1208 are placed on an upper surface of the posts 1408, as shown in FIG. 14. Since the solder bumps are on the conductive side of each die, the conductive side of each die is closest to the posts. The solder bumps 1208 are reflowed (1308), which comprises softening the solder possibly by heating so that the solder bumps 1208 become attached to the posts 1408. The solder electrically and mechanically connects the conductive pads to the posts. A solder past may be added to the top of the posts before the bumped dice are placed. In the alternative, a solder paste may be added to the top of the post and dice that are not bumped may be used.

Figure 15:
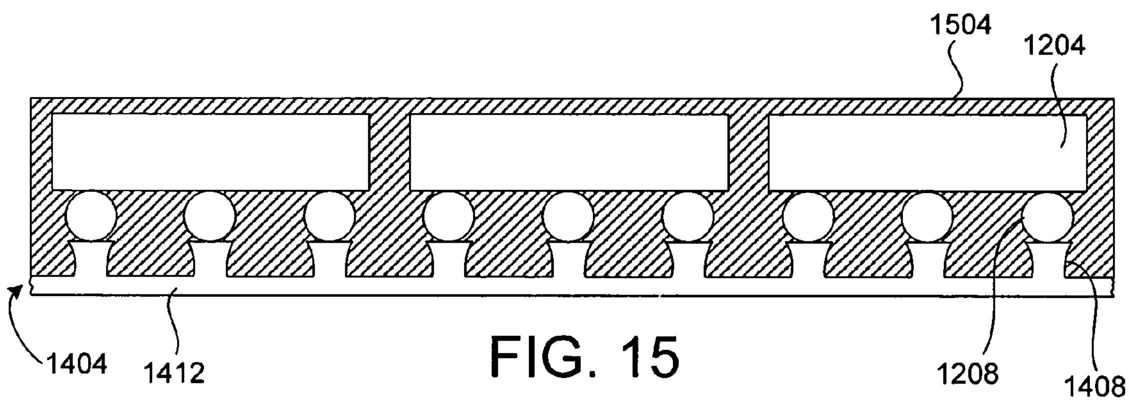
FIG. 15 is a cross-sectional view of part of the lead frame and dice after encapsulation.

The dice 1204 may then be encapsulated (step 316). Using conventional molding, the dice 1204 can be encapsulated by encapsulating material 1504, as shown in FIG. 15. If a dispensing method is used, then a dam may be placed around the lead frame 1404. The connecting sheet 1412 helps to prevent the encapsulating material from flowing under the lead frame 1404, thus keeping the encapsulating material on one side of the lead frame 1404. The encapsulating material 1504 may then be hardened and cured to form a cap. One cap may be used to cover the entire lead frame. In the alternative, several caps may be provided at various parts of the lead frame.

Figure 16:
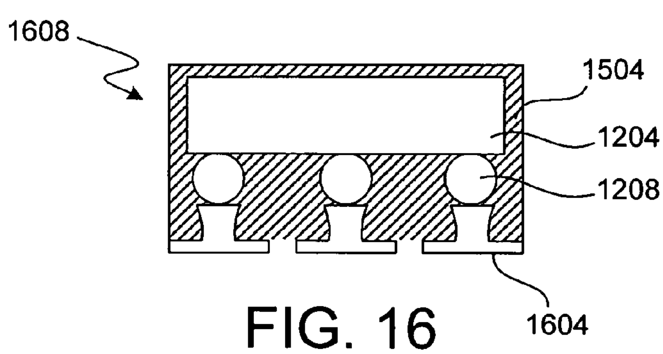
FIG. 16 is a cross-sectional view of a resulting IC package with leads.

The lead frame 1404, dice 1204, and encapsulating material 1504 may be mounted on sticky tape and then placed on a vacuum chuck of sawing equipment, which is known in the art. The sawing equipment may be used for removing at least part of the connecting sheet 1412 (step 320). In such a removal process, the sawing equipment cuts through only the connecting sheet 1412 between the posts 1408. The removal of at least part of the connecting sheet forms the posts 1408 into lead fingers 1604, which may be electrically isolated from each other, as shown in FIG. 16. If the IC packages have not been singulated, the frame is in one piece held by the encapsulating material 1504, which allows all IC packages to be tested in panel form (step 324). After testing, the saw equipment may then be used to singulate the lead frame 1404, dice 1204, and encapsulating material 1504 into individual IC packages 1608, as shown in FIG. 16. In such a singulation process, the sawing equipment cuts through the encapsulating material 1504.

The use of a saw to separate the posts provides the lead fingers 1604 or pins. Such lead fingers or pins are preferable. In the alternative, the connecting sheet may be thinned by etching, as described in U.S. patent application Ser. No. 09/528,540, entitled "Leadless Packaging Process Using a Conductive Substrate," by Bayan et al., filed Mar. 20, 2000, to provide a leadless IC package.

Since the lead frame 1404 has the same array as described in the previous embodiment, the lead frame 1404 is a universal lead frame, which may accommodate dice of different sizes.

Figure 17:
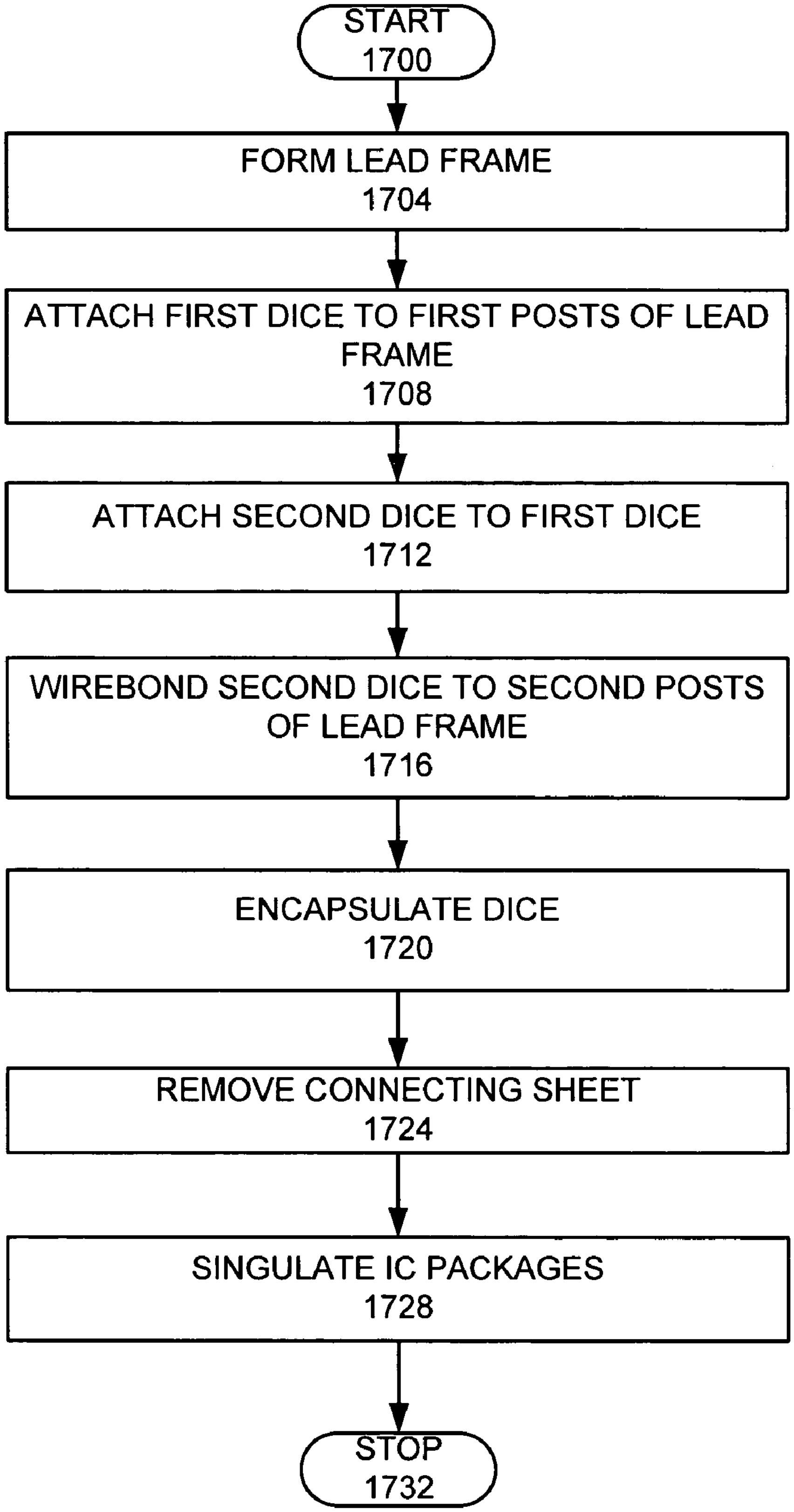
FIG. 17 is a flow chart of a method of making another embodiment of the invention.
Figure 18:
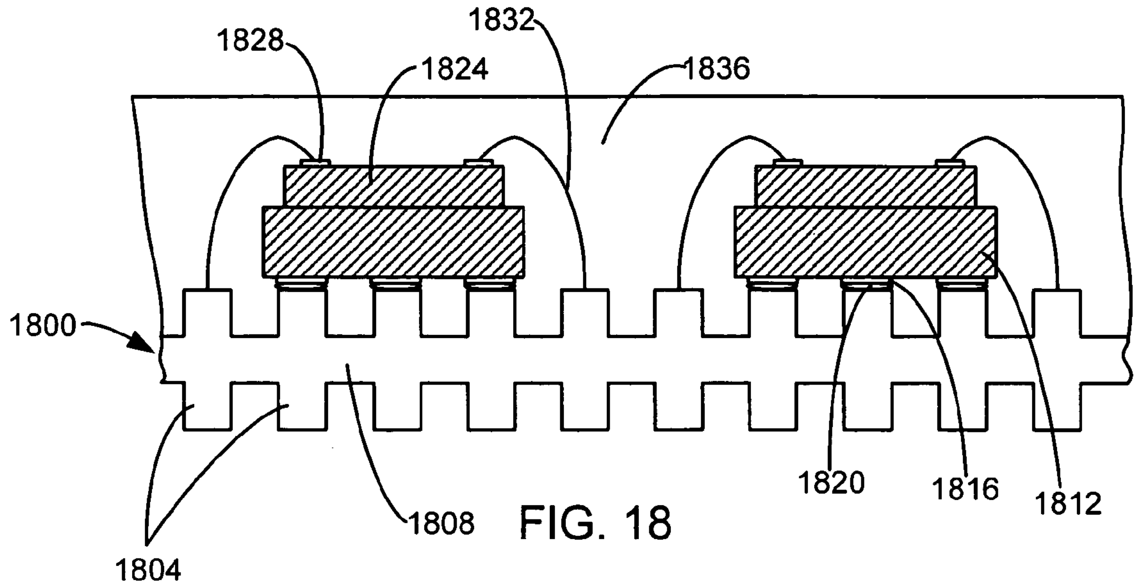
FIG. 18 is a cross-sectional view of a lead frame and dice after encapsulation.

FIG. 17 is a flow chart of a method of making another embodiment of the invention. A lead frame is formed (step 1704). FIG. 18 is a cross-sectional view of part of a lead frame 1800 that may be used in this embodiment of the invention. The lead frame 1800 may be formed by stamping or etching a sheet of metal. The lead frame 1800 provides a plurality of posts 1804. In this embodiment, the posts 1804 all have the same cross-section. In addition, the posts 1804 are spaced apart to form an array. As illustrated, in this embodiment a connecting sheet 1808 extends through the lead frame 1800 so that the connecting sheet 1808 is connected through the center of each of the posts 1804. The connecting sheet 1808 is imperforate in that it extends between the posts 1804 without any apertures. Plating, such as silver plating, may be added to the lead frame 1800.

A plurality of first dice 1812 is attached to the lead frame 1800 (step 1708). A plurality of conductive pads 1816 is on a conductive side of the first dice 1812. The conductive pads 1816 are electrically and mechanically attached to a first set of the plurality of posts 1804 by an electrically conductive adhesive 1820, such as conductive epoxy or solder. Since the conductive pads are held to posts by an electrically conductive adhesive 1820, the conductive side of the first dice 1812 is adjacent to the first set of the plurality of posts 1804 and the conductive side of the dice is the closest part of each die to the posts.

A plurality of second dice 1824 is attached to the plurality of first dice 1812, so that a non-conductive side of each second die 1824 is attached to a non-conductive side of a first die 1812. Conductive pads 1828 on a conductive side of the second dice 1824 are electrically connected to a second set of the plurality of posts 1804 by wire bonds 1832 (step 1716). The non-conductive sides of the first die 1812 are opposite from the conductive sides of the first dice 1812, and the non-conductive sides of the second dice 1824 are opposite from the conductive sides of the second dice 1824, as shown.

The plurality of first dice 1812 and plurality of second dice 1824 may then be encapsulated (step 1720). Using conventional molding the lead frame 1800 can be encapsulated by an encapsulating material 1836. Since the connecting sheet 1808 is imperforate in that it extends between the posts without any apertures, the connecting sheet prevents the encapsulating material from flowing under the lead frame 1800, thus keeping the encapsulating material 1836 on one side of the lead frame 1800. The encapsulating material may then be hardened and cured to form a cap. One cap may be used to cover the entire lead frame. In the alternative, several caps may be provided at various parts of the lead frame.

Figure 19:
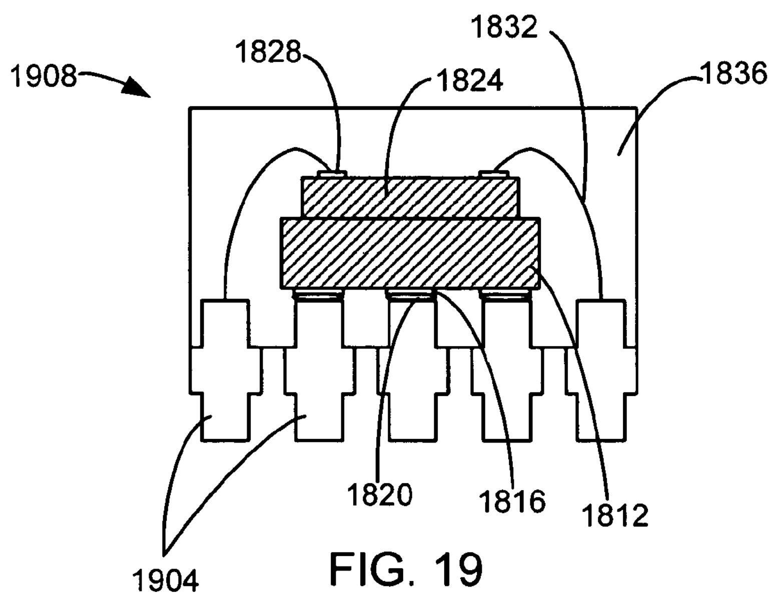
FIG. 19 is a cross-sectional view of a resulting IC package.

The lead frame 1800 and encapsulating material 1836 may be mounted on sticky tape and then placed on a vacuum chuck of sawing equipment, which is known in the art. The sawing equipment may be used for removing all or parts of the connecting sheet 1808 (step 1724). In such a removal process, the sawing equipment may cut through only the connecting sheet 1808 between the plurality of posts 1804. The removal of parts of the connecting sheet forms the posts 1804 into lead fingers 1904, which may be electrically isolated from each other, as shown in FIG. 19. Since the IC packages have not been singulated, the IC packages are in one piece held together by the encapsulating material 1836. This allows all IC packages to be tested in panel form, which allows faster and easier testing. After testing, the saw equipment may then be used to singulate the lead frame 1800 and encapsulating material 1836 into individual IC packages 1908 (step 1728). In such a singulation process, the sawing equipment cuts through the encapsulating material 1836.

If panel testing is not desired, then the chip scale IC packages may be singulated before electrical testing. In such a case, singulation may be performed during the step of removing the connection sheet. In other embodiments, other methods besides using saw equipment, such as etching or laser cutting, may be used to remove the connection sheet and/or for singulation.

The resulting IC package is able to package a first die and a second die with a resulting footprint that is slightly larger than one of the dice. By mounting the first die so that the conductive side is facing the lead fingers so that the lead fingers are directly connected to the conductive pads, the lead fingers have a footprint about equal to the footprint of the first die. In addition, the placement of the conductive side of the first die adjacent to the lead fingers allows the placement of a non-conductive side of the second die on a non-conductive side of the first die, so that the conductive side of the second die faces away from the lead fingers. The wire bonding of conductive pads of the second die to the second set of lead fingers provides an IC package footprint for two packaged dice, which is about equal to the footprint of a conventional IC package for a single die.

In other embodiments, a universal lead frame with an array of posts may have the posts in the array closer together (a smaller distance and pitch between posts) to allow a higher number of contact posts for a particular die size. In another embodiment, a universal lead frame may have a rectangular array where the posts are arranged in columns and rows where the distance between (pitch of) the rows is different than the distance between the columns. Posts in other embodiments may be rectangular, circular, or have some other cross-section instead of having a square cross-section. The posts may be placed in other patterns, such as in a circular pattern.

Other methods may be used to bond the die to the lead frame, with these methods preferably providing an electrically conductive mechanical bond between the conductive pads and the posts.

While this invention has been described in terms of several preferred embodiments, there are alterations, modifications, permutations, and substitute equivalents which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. An integrated circuit package, comprising:
- a first die with a conductive side;
- a plurality of lead posts, wherein the conductive side of the first die faces the plurality of lead posts, each of the lead posts positioned on a plurality of lead fingers respectively, each of the plurality of lead fingers electrically isolated from one another; and
- an encapsulating material encapsulating the first die, the lead posts and formed between the plurality of lead fingers to electrically isolate the lead fingers from one another.

2. The integrated circuit package, as recited in claim 1, wherein the conductive side of the first die is mechanically and electrically connected to the plurality of lead posts.

3. The integrated circuit package, as recited in claim 2, wherein the conductive side comprises a plurality of spaced apart conductive pads, which are mechanically and electrically connected to the lead posts.

4. The integrated circuit package, as recited in claim 3, wherein the plurality of conductive pads is mechanically and electrically connected to the lead posts by conductive epoxy.

5. The integrated circuit package, as recited in claim 2, wherein the lead posts have equal spacing and pitch.

6. The integrated circuit package, as recited in claim 2, wherein the lead posts have a square cross section.

7. The integrated circuit package, as recited in claim 2, wherein the lead posts have a round cross section.

8. The integrated circuit package, as recited in claim 2, wherein the lead posts have lengths which are substantially perpendicular to the conductive side of the first die.

9. The integrated circuit package, as recited in claim 2, further comprising a second die with a conductive side and a side opposite the conductive side, wherein the side opposite the conductive side is connected to a side opposite the conductive side of the first die.

10. The integrated circuit package, as recited in claim 9, further comprising wirebonding connected between the conductive side of the second die and at least one lead post of the plurality of lead posts.

11. An integrated circuit package comprising:
- an array of lead posts that are equally spaced apart, each of the lead posts positioned on a an array of lead fingers, each of the lead fingers electrically isolated from one another, each of the lead posts further having an oversized contact pad on a bottom surface of the integrated circuit package, wherein each oversized contact pad has a diameter that is larger than a diameter of a respective lead post;
- a first die having a conductive side that is electrically and mechanically connected to at least some of lead posts within the array of lead posts, wherein the conductive side of the first die faces the lead posts; and
- an encapsulating material that encapsulates the first die and between the individual lead fingers of the array of lead fingers.

12. An integrated circuit package as recited in claim 11 wherein the conductive side of each of the first dice is in direct contact with at least some of the lead posts.

13. An integrated circuit package as recited in claim 11, further comprising:
- a second die that is attached to the first die, wherein the second die has a conductive side and a side opposite the conductive side, wherein the side opposite the conductive side of each second die is connected to a side opposite the conductive side of the fit die, wherein the second die has a plurality of conductive pads on the conductive side of the second die; and interconnecting wires that connect the conductive pads of the second die to lead posts of the array of lead posts, wherein the encapsulating material also encapsulates the second die and each of the interconnecting wires.

14. An integrated circuit package as recited in claim 11 wherein the encapsulating material has a top and a bottom surface and wherein each of the oversized contact pads are formed on the bottom surface of the encapsulating material.

15. An integrated circuit package as recited in claim 11 wherein each of the oversized contact pads have a substantially square outline.

16. An apparatus comprising a lead frame having a substantially continuous and planer first surface and a plurality of posts formed on the second surface;

a semiconductor die having an active surface, the active surface having a plurality of conductive pads in contact with the plurality of posts of the lead frame respectively;

an encapsulant material encapsulating the semiconductor die and the plurality of posts in contact with the plurality of conductive pads on the semiconductor die, the substantially continuous and planer second surface of the lead frame acting to prevent the encapsulant from forming on the second surface of the lead frame.

17. The apparatus of claim 16, wherein the encapsulant is formed between the plurality of posts.

18. The apparatus of claim 16, further comprising a conductive epoxy between the plurality of posts and the plurality of conductive pads respectively.

19. An apparatus, comprising:

a lead frame having a first surface and a substantially planar second surface, a set of posts formed on the first surface of the lead frame, the plurality of post organized into a plurality of sub-sets of posts, a plurality of semiconductor die, each of the plurality of die having conductive pads mounted onto the plurality of subsets of posts respectively; and continuous encapsulant material encapsulating the lead frame including the plurality of semiconductor die and the plurality of sub-sets of posts, the substantially planer second surface of the lead frame act to prevent the encapsulant from forming on the second surface of the lead frame.

20. The apparatus of claim 19, conductive epoxy provided between the plurality of posts and the plurality of conductive pads of the semiconductor die respectively.

21. The apparatus of claim 19, further comprising a space formed between the plurality of semiconductor die mounted onto the sub-sets of posts of the lead frame respectively, the space being sufficient to singulate the individual semiconductor die from the lead frame using a cutting tool.

* * * * *

UNITED STATES PATENT AND TRADEMARK OFFICE

CERTIFICATE OF CORRECTION

PATENT NO. : 6,975,038 B1
APPLICATION NO. : 10/625917
DATED : December 13, 2005
INVENTOR(S) : Shahram Mostafazadeh It is certified that error appears in the above-identified patent and that said Letters Patent is hereby corrected as shown below:

In line 7 of claim 13 (column 9, line 2) change “fit die” to --first die--.

In line 13 of claim 19 (column 10, line 18) change “act to” to --acting to--.

Signed and Sealed this

Eighteenth Day of July, 2006

JON W. DUDAS
*Director of the United States Patent and Trademark Office*